(12) United States Patent
Zheng

(10) Patent No.: US 11,152,593 B1
(45) Date of Patent: Oct. 19, 2021

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Ying Zheng, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 189 days.

(21) Appl. No.: 16/623,121

(22) PCT Filed: Aug. 5, 2019

(86) PCT No.: PCT/CN2019/099249
§ 371 (c)(1),
(2) Date: Dec. 16, 2019

(87) PCT Pub. No.: WO2020/248348
PCT Pub. Date: Dec. 17, 2020

(30) Foreign Application Priority Data

Jun. 10, 2019 (CN) .......................... 201910495048.7

(51) Int. Cl.
*H01L 51/52* (2006.01)
*H01L 27/32* (2006.01)

(52) U.S. Cl.
CPC ...... *H01L 51/5253* (2013.01); *H01L 27/3234* (2013.01); *H01L 27/3246* (2013.01)

(58) Field of Classification Search
CPC ............ H01L 51/5253; H01L 27/3234; H01L 27/3246
(Continued)

(56) References Cited

U.S. PATENT DOCUMENTS

2014/0022819 A1* 1/2014 Oh .................... G02F 1/133617
362/607
2017/0062769 A1* 3/2017 Kim .................... H01L 51/5275
(Continued)

FOREIGN PATENT DOCUMENTS

CN 105022511 A 11/2015
CN 107315207 A 11/2017
(Continued)

*Primary Examiner* — David Vu
*Assistant Examiner* — Brandon C Fox
(74) *Attorney, Agent, or Firm* — Osha Bergman Watanabe & Burton LLP

(57) ABSTRACT

The present invention relates to a display panel and a display device. On the one hand, the display panel disposes a groove, which forms on one side of a packaging layer of a display area away from a substrate, and extends downward to one side of an antireflective film facing a thin film transistor layer; and a camera is disposed on one side of the substrate away from the thin film transistor layer and is corresponding the groove, thereby reducing process flow, improving productivity and yield, and realizing a full screen. On the other hand, the present invention also adds an antireflective film to improve the light transmittance at the groove and avoid the phenomenon that the camera is difficult to image.

10 Claims, 2 Drawing Sheets

(58) Field of Classification Search
USPC .......................................................... 257/40
See application file for complete search history.

(56) References Cited

U.S. PATENT DOCUMENTS

| | | |
|---|---|---|
| 2019/0011601 A1 | 1/2019 | Yu |
| 2019/0123115 A1 | 4/2019 | Sun et al. |
| 2019/0235330 A1* | 8/2019 | Park .................. G02F 1/133514 |
| 2019/0252415 A1* | 8/2019 | Wan .................... H01L 27/1262 |
| 2020/0043992 A1 | 2/2020 | Zuo et al. |
| 2020/0119109 A1 | 4/2020 | Puszka et al. |

FOREIGN PATENT DOCUMENTS

| | | |
|---|---|---|
| CN | 107658332 A | 2/2018 |
| CN | 107785400 A | 3/2018 |
| CN | 108269839 A | 7/2018 |
| CN | 109065756 A | 12/2018 |
| CN | 109390371 A | 2/2019 |
| CN | 109599414 A | 4/2019 |

\* cited by examiner

DISPLAY PANEL AND DISPLAY DEVICE

BACKGROUND OF THE INVENTION

1. Field of the Invention

The present disclosure relates to a display technical field, and more particularly to a display panel and a display device.

2. Description of the Prior Art

An OLED (Organic Light-Emitting Diode) device is also called an organic electro-laser display device and an organic light-emitting semiconductor. The basic structure of the OLED is a sandwich-like structure constructed by a thin transparent indium tin oxide (ITO) with semiconductor properties connected to an anode of a power and a metal surface cathode. The whole structure includes a hole transport layer (HTL), an electroluminescent layer (EL) and an electron transport layer (ETL). When the power is supplied to an appropriate voltage, holes of the anode and electrons of the surface cathode will combine in the electroluminescent layer, and form excitons (electron-hole pairs) in an excited state with a certain probability under the action of a Coulomb force. But the excited state is unstable in normal environment. The exciton combination in the excited state can transfer energy to the luminescent material. It can enable the luminescent material to transition from a ground state to the excited state. The energy of the excited state can produce photons through radiation relaxation process; the photons release light energy and produce brightness. According to its formula, it produces three basic colors (RGB): red, green and blue, which constitute the basic color.

First of all, the OLED is characterized by self-luminescence. The OLED is unlike a thin film transistor-liquid crystal display device, which requires backlight, so the visibility and brightness of the OLED are high. Secondly, the OLED has the advantages of low voltage demand, high power saving efficiency, fast response, light weight, thin thickness, simple structure, low cost, wide viewing angle, almost infinitely high contrast, low power consumption and high reaction speed. It has become one of the most important display technologies nowadays. It is gradually replacing TFT-LCD and is expected to become the next generation of mainstream display technology after LCD.

BRIEF SUMMARY OF THE INVENTION

Technical Problem

Because the OLED is easy to customize its appearance, more and more terminal manufacturers are applying it to a full screen and borderless product. But the full screen and borderless product requires a larger luminous area. Therefore, in the actual application, a flexible organic light-emitting display usually requires to dispose installation holes for reserving hardware installation locations such as a front-facing camera, an earphone and a start key on a terminal device. At present, the installation holes are generally disposed in a non-display area outside an effective display area of the display panel. In this way, the area of the effective display area is limited, and the full screen cannot be prepared. Hence, it needs to seek a new display panel and a new display device to solve the above problems.

Technical Solutions

One object of the present invention is to provide a display panel and a display device, which can solve the problems that the existed display panel restricts the display area and cannot realize a full screen.

In order to solve the above problems, in one embodiment, the present invention provides a display panel, defining a display area and including a substrate, an antireflective film, a thin film transistor layer and a packaging layer. Wherein, the antireflective film is disposed on the substrate; the thin film transistor layer is disposed on the antireflective film; and the packaging layer is disposed on the thin film transistor layer. Wherein a groove is formed on one side of the packaging layer of the display area away from the substrate, and extends downward to one side of the antireflective film facing a thin film transistor layer.

Further, wherein the groove is rectangular or inverted trapezoidal in shape.

Further, wherein the number of the groove is two or more.

Further, wherein the antireflective film is formed on the substrate by an ion beam assisted deposition process or a chemical deposition process.

Further, wherein the antireflective film includes a first film, a second film and a third film; the first film is formed on the substrate; a refractive index of the second film to an incident light is greater than that of the first film and the third film to the incident light, and a refractive index of the first film to an incident light is greater than that of the third film to the incident light.

Further, wherein a material of the first film is $Al_2O_3$, a material of the second film is ZrO2, and a material of the third film is SiO2.

Further, wherein all of thicknesses of the first film, the second film and the third film are 100-300 nm.

Further, wherein a thickness of the first film is 110-150 nm, a thickness of the second film is 240-280 nm, and a thickness of the third film is 110-150 nm.

Further, wherein the display panel further includes: anodes, a pixel definition layer, a light emitting layer and a cathode. Wherein, the anodes are arranged at interval on the thin film transistor layer; the pixel definition layer is disposed on the thin film transistor layer and located between two adjacent anodes; the light emitting layer is disposed on the anodes and the pixel definition layer; and the cathode is disposed on the light emitting layer. Wherein, the packaging layer is disposed on the cathode.

In another embodiment, the present invention further provides a display device, comprising a display panel and a camera located under the display panel; wherein the display panel is provided by the present invention, and the camera is disposed under the display panel and is corresponding to the groove.

Beneficial Effect

The present invention relates to the display panel and the display device. On the one hand, the groove forms on one side of the packaging layer of the display area away from the substrate, and extends downward to one side of the antireflective film facing the thin film transistor layer; and the camera is disposed on one side of the substrate away from the thin film transistor layer and is corresponding to the groove, thereby reducing process flow, improving productivity and yield, and realizing the full screen. On the other hand, the present invention also adds the antireflective film to improve the light transmittance at the groove and avoid the phenomenon that the camera is difficult to image.

BRIEF DESCRIPTION OF THE DRAWINGS

For more clearly illustrating the technical scheme in the embodiment of the present invention, the following text will briefly introduce the accompanying drawings used in the embodiment. It is obvious that the accompanying drawings in the following description are only some embodiments of the present invention. For the technical personnel of the field, other drawings can also be obtained from these drawings without paying creative work.

The components in the figure are identified as follows.

Figure 1:
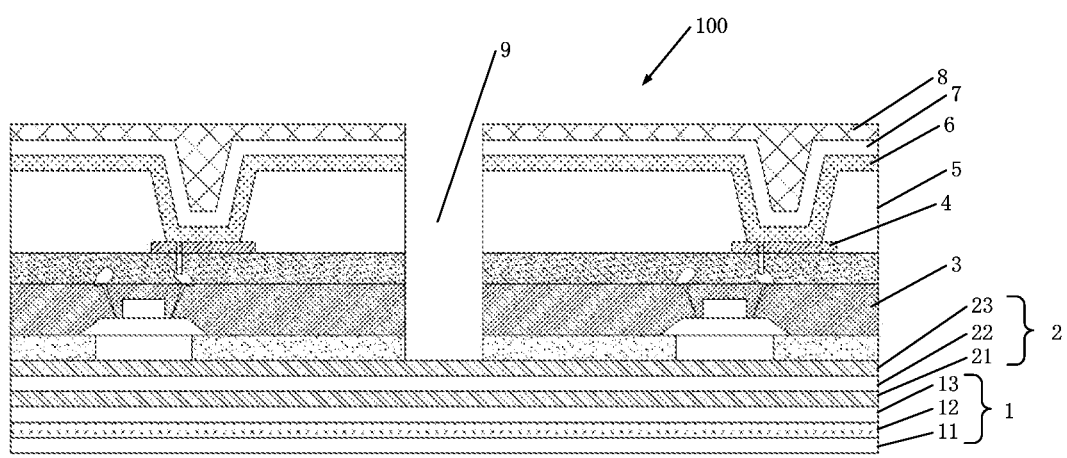
FIG. 1 is a structure schematic view of a display panel of the present invention.

| 100 display panel | 200 camera |
|---|---|
| 1 substrate | 2 antireflective film |
| 3 thin film transistor layer | 4 anode |
| 5 pixel definition layer | 6 light emitting layer |
| 7 cathode | 8 packaging layer |
| 9 groove | 11 first underlayer |
| 12 intermediate layer | 13 second underlayer |
| 21 first film | 22 second film |
| 23 third film | |

DETAILED DESCRIPTION OF THE PREFERRED EMBODIMENTS

The preferred embodiments of the present invention are described in detail below with reference to the accompanying drawings, in order to fully introduce the technical contents of the present invention to the technical personnel in the field, and to demonstrate with examples that the present invention can be implemented, so as to make the technical contents of the present invention clearer and make it easier for the technical personnel in the field to understand how to implement the present invention. However, the present invention can be embodied by many different forms of embodiments. The protection scope of the present invention is not limited to the embodiments mentioned herein, and the description of the following embodiments is not intended to limit the scope of the present invention.

Directional terms mentioned in the present invention, such as "top", "bottom", "front", "back", "left", "right", "inner", "outer", "side" etc., are only used with reference to the orientation of the accompanying drawings. The directional terms used herein are intended to explain and illustrate, but not to limit, the protection scope of present invention.

In the figures, units with similar structures are represented by the same label. Components with similar structures or functions everywhere are represented by similar numeric labels. In addition, for ease of understanding and description, the size and thickness of each component shown in the drawings are arbitrarily shown, and the present invention does not limit the size and thickness of each component.

When one component is described as "on another component", the component may be directly placed on another component; or there exists an intermediate component, the component is placed on the intermediate component, and then the intermediate component is placed on another component. Moreover, when one component is described as "installed to" or "connected to" another component, they can be understood as "installed" or "connected" directly; or they can be understood that one component is "installed to" or "connected to" another component through an intermediate component.

Embodiment 1

Referring to FIG. 1, a display panel 100 defines a display area, and includes a substrate 1, an antireflective film 2, a thin film transistor layer 3, anodes 4, a pixel definition layer 5, a light emitting layer 6, a cathode 7 and a packaging layer 8.

Wherein, the substrate 1 includes a first underlayer 11, an intermediate layer 12 and a second underlayer 13. The thicknesses of the first underlayer 11 and the second underlayer 13 are 6-10 microns (μm). If the thicknesses of the first underlayer 11 and the second underlayer 13 are less than 6 μm, the production cost thereof will increase due to production process problems. If the thicknesses of the first underlayer 11 and the second underlayer 13 are greater than 10 μm, the overall thickness of the display panel 100 will increase, which affects the beauty of the product and the feel of the use. The material of the first underlayer 11 and the second underlayer 13 can be polyimide, and the first underlayer 11 and the second underlayer 13 made from the polyimide have good flexibility. The material of the intermediate layer 12 may be $SiO_2$ or $SiN_x$, or a laminated structure of SiO 2 and $SiN_x$. The prepared intermediate layer 12 has good water and oxygen resistance and can also improve the reliability between the first underlayer 11 and the second underlayer 13.

Wherein the thin film transistor layer 3 is disposed on the substrate 1, the antireflective film 2 is disposed between the substrate 1 and the thin film transistor layer 3. The antireflective film 2 includes a first film 21, a second film 22 and a third film 23. Wherein the first film 21 is disposed on the substrate 1, the second film 22 is disposed on the first film 21, and the third film 23 is disposed on the second film 22. The antireflective film 2 can be formed on the substrate 1 by an ion beam assisted deposition process or a chemical deposition process.

Wherein, a refractive index of the second film 22 to an incident light is greater than that of the first film 21 and the third film 23 to the incident light, and a refractive index of the first film 21 to an incident light is greater than that of the third film 23 to the incident light. Specifically, a material of the first film 21 is $Al_2O_3$, a material of the second film 22 is ZrO2, and a material of the third film 23 is SiO2. Thus, the transmittance of the display panel 100 can be effectively improved by using the three-layer anti-reflection film structure of λ/4-λ/2-λ/4. In addition, the antireflective film 2 can also provide a good water oxygen barrier effect, to avoid an abnormal display of the display area of the light emitting layer 6 caused by water vapor intrusion.

Wherein, thicknesses of the first film 21, the second film 22 and the third film 23 are 100-300 nm. Specifically, the thickness of the first film 21 is 110-150 nm, the thickness of the second film 22 is 240-280 nm, and the thickness of the third film 23 is 110-150 nm. Thus, the transmittance can be increased and achieve the best effect.

Wherein, the anodes 4 are arranged at interval on the thin film transistor layer 3; the pixel definition layer 5 is disposed between two adjacent anodes 4 on the thin film transistor layer 3; the light emitting layer 6 is disposed on the anodes 4 and the pixel definition layer 5; the cathode 7 is disposed on the light emitting layer 6; and the packaging layer 8 is disposed on the cathode 7.

The display panel 100 of the embodiment disposes a groove 9, which forms on one side of the packaging layer 8 of the display area away from the substrate 1, and extends downward to one side of the antireflective film 2 facing the thin film transistor layer 3. The groove 9 can be rectangular or inverted trapezoidal in shape. In the embodiment, the groove 9 is rectangular in shape. In the actual production, according to the actual demand, the number of the groove 9 can be increased to two or more. In the embodiment, by setting the groove 9 in the display area of the display panel 100, the display area can be increased and the full screen can be achieved.

Embodiment 2

The differences between the second embodiment and the first embodiment are explained below, and their similarities are not repeated here.

Figure 2:
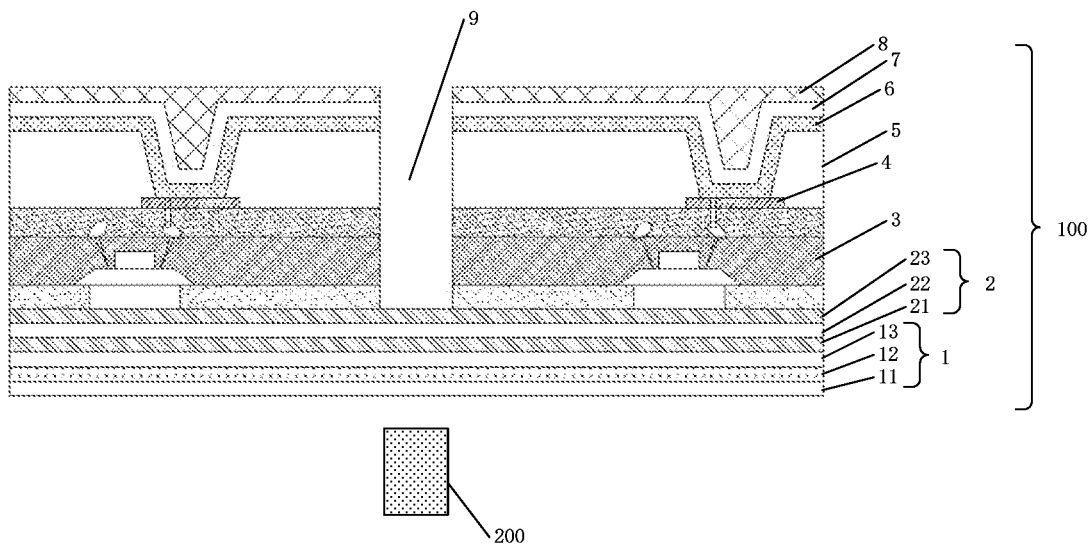
FIG. 2 is a structure schematic view of a display device of the present invention.

Referring to FIG. 2, the embodiment further provides a display device, which includes the display panel 100 of the present invention and a camera 200 located under the display panel 100. The camera 200 is located under the display panel 100 and is corresponding to the groove 9. Thus, the display area can be increased and the full screen can be achieved.

Specifically, a projection area of the groove 9 in the display panel 100 can be larger than that of the camera 200, so as to increase a lighting area of the camera 200, improve an imaging effect of the camera 200 and increase a customer experience.

Figure 3:
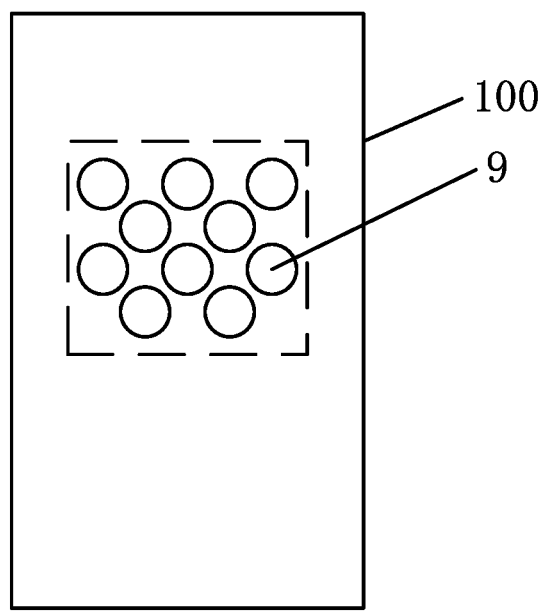
FIG. 3 is a plan view of the display panel of the present invention.

As shown in FIG. 3, in the actual production, the number of the groove 9 can be increased to two or more. The grooves 9 are arranged to form an open area shown by dotted lines in the drawing. The camera 200 is corresponding to the open area, thereby achieving the same display effect, increasing the display area, and achieving the full screen effect.

The display panel and the display device provided by the present invention are described in detail above. It should be understood that the exemplary embodiments described herein should be considered descriptive only to help understand the methods and core ideas of the invention, and not to limit the invention. The description of features or aspects in each exemplary embodiment should generally be considered to be applicable to similar features or aspects in other exemplary embodiments. Although the present invention is described with reference to exemplary embodiments, various changes and modifications may be recommended by those skilled in the art. The present invention intends to cover these changes and changes within the scope of the appended claims. Any modification, equivalent replacement and improvement made within the spirit and principles of the present invention shall be included in the scope of protection of the present invention.

What is claimed is:

1. A display panel, defining a display area and including:
   a substrate;
   an antireflective film, being disposed on the substrate;
   a thin film transistor layer, being disposed on the antireflective film; and
   a packaging layer, being disposed on the thin film transistor layer;
   wherein a groove is formed on one side of the packaging layer of the display area away from the substrate, and extends downward to one side of the antireflective film facing a thin film transistor layer.

2. The display panel as claimed in claim 1, wherein the groove is rectangular or inverted trapezoidal in shape.

3. The display panel as claimed m claim 1, wherein the number of the groove is two or more.

4. The display panel as claimed in claim 1, wherein the antireflective film is formed on the substrate by an ion beam assisted deposition process or a chemical deposition process.

5. The display panel as claimed in claim 1, wherein the antireflective film includes a first film, a second film and a third film; the first film is formed on the substrate; a refractive index of the second film to an incident light is greater than that of the first film and the third film to the incident light, and a refractive index of the first film to an incident light is greater than that of the third film to the incident light.

6. The display panel as claimed in claim 5, wherein a material of the first film is Al2O3, a material of the second film is ZrO2, and a material of the third film is SiO2.

7. The display panel as claimed in claim 5, wherein thicknesses of the first film, the second film and the third film are 100-300 nm.

8. The display panel as claimed in claim 5, wherein a thickness of the first film is 110-150 nm, a thickness of the second film is 240-280 nm, and a thickness of the third film is 110-150nm.

9. The display panel as claimed in claim 1, wherein further including:
   anodes, being arranged at interval on the thin film transistor layer;
   a pixel definition layer, being disposed on the thin film transistor layer and located between two adjacent anodes;
   a light emitting layer, being disposed on the anodes and the pixel definition layer; and
   a cathode, being disposed on the light emitting layer;
   wherein the packaging layer is disposed on the cathode.

10. A display device, comprising a display panel and a camera located under the display panel; wherein the display panel is the display panel as claimed in claim 1, and the camera is disposed under the display panel and is corresponding to the groove.

* * * * *